(12) United States Patent
Lee et al.

(10) Patent No.: US 12,206,396 B2
(45) Date of Patent: Jan. 21, 2025

(54) LOW VOLTAGE DETECTION FLOATING N-WELL BIAS CIRCUIT

(71) Applicant: DB HiTek Co., Ltd., Bucheon-si (KR)

(72) Inventors: Sang Mok Lee, Bucheon-si (KR); Hyun Sup Jung, Bucheon-si (KR); Seung Hyun Kou, Bucheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 89 days.

(21) Appl. No.: 18/316,291

(22) Filed: May 12, 2023

(65) Prior Publication Data
US 2024/0267043 A1    Aug. 8, 2024

(30) Foreign Application Priority Data
Feb. 6, 2023  (KR) .................. 10-2023-0015422

(51) Int. Cl.
*H03K 17/16*      (2006.01)
*H03K 17/10*      (2006.01)
*H03K 17/687*     (2006.01)

(52) U.S. Cl.
CPC ......... *H03K 17/162* (2013.01); *H03K 17/102* (2013.01); *H03K 17/687* (2013.01)

(58) Field of Classification Search
CPC .................................................. H03K 17/162
USPC ........................................................ 327/382
See application file for complete search history.

(56) References Cited

U.S. PATENT DOCUMENTS

| | | | |
|---|---|---|---|
| 5,963,055 A * | 10/1999 | Tanaka ............. | H03K 19/00315 326/86 |
| 7,768,299 B2 | 8/2010 | Gupta et al. | |
| 8,890,602 B2 | 11/2014 | Sinha et al. | |
| 11,215,648 B1 * | 1/2022 | Lee ..................... | G01R 19/155 |

FOREIGN PATENT DOCUMENTS

KR      10-1120263 B1      3/2012

* cited by examiner

*Primary Examiner* — Tomi Skibinski
(74) *Attorney, Agent, or Firm* — Andrew D. Fortney; Central California IP Group, P.C.

(57) ABSTRACT

Disclosed is a low-voltage detection floating N-well bias circuit. The circuit includes a power detector configured to detect states of first power (VDD) and second power (DVDD) at different power levels; a switch configured to perform a switching operation according to the states of the first power (VDD) and the second power (DVDD); and a voltage output circuit configured to output the first power (VDD) or the second power (DVDD) as an N-well bias voltage according to the states of the first power (VDD) and the second power (DVDD) and the switching operation of the switch. Accordingly, when the first power (VDD) and the second power (DVDD) are supplied and the second power (DVDD) has a low voltage state, the floating N-well bias circuit can continuously bias an N-well with the second power (DVDD), without dropping the second power (DVDD).

19 Claims, 1 Drawing Sheet

LOW VOLTAGE DETECTION FLOATING N-WELL BIAS CIRCUIT

CROSS REFERENCE TO RELATED APPLICATION

The present application claims priority to Korean Patent Application No. 10-2023-0015422, filed Feb. 6, 2023, the entire contents of which are incorporated herein for all purposes by this reference.

BACKGROUND OF THE INVENTION

Field of the Invention

The present disclosure relates to a low-voltage detection floating N-well bias circuit, the circuit being capable of biasing a floating N-well when a first power and a second power are supplied and the second power has a low voltage state, without dropping the second voltage.

Description of the Related Art

In general, a CMOS inverter may include an NMOS transistor and a PMOS transistor. In this case, the gate of the NMOS transistor and the gate of the PMOS transistor are electrically connected to each other to form an input terminal of the inverter, and the drain of the NMOS transistor and the drain of the PMOS transistor are electrically connected to form an output terminal of the inverter. The NMOS transistor is in a P-well, and the PMOS transistor is in an N-well. In addition, a power supply voltage, VDD, is applied to the N-well, and a well bias voltage and a ground potential Vss, is applied to the P-well. The well bias voltage applied to the P-well and the N-well improves threshold voltage (Vth) characteristics, and helps stabilize the electrical characteristics of the transistors.

In order to adjust the threshold voltage of an MOS transistor and prevent a latch-up caused by a parasitic bipolar transistor, a particular bias is applied to the well in which the transistor is located. To apply this bias, an impurity doped region is provided in a substrate, apart from the well. In addition, a first impurity-doped well bias region applies a low voltage (VSS) well bias to a P-well, and a second impurity-doped well bias region applies a high voltage (VDD) well bias to an N-well.

A well bias circuit that applies a particular bias to a well bias region needs to effectively control the well bias in quick response to a rapid change in an external supply power of first power (VDD) or an internal supply power of second power (DVDD) or both, and needs to avoid generating a leakage current path in each mode.

In the related art, a well bias circuit capable of protecting a circuit by blocking a latch-up phenomenon and a leakage current path has been proposed.

FIG. 1 is a configuration diagram illustrating a general floating N-well bias circuit.

As shown in FIG. 1, a first PMOS transistor (MP1) and a second PMOS transistor (MP2) are arranged symmetrically to each other. A body region and a drain terminal of the first PMOS transistor (MP1) are connected to each other, and a body region and a drain terminal of the second PMOS transistor (MP2) are connected to each other. The second/internal power supply (DVDD) is applied to a gate terminal of the first PMOS transistor (MP1), and the first/external power supply (VDD) is applied to a gate terminal of the second PMOS transistor (MP2). The first power (VDD) and the second power (DVDD) may have different voltage levels.

In FIG. 1, the higher of the first power (VDD) and the second power (DVDD) is applied as a bias voltage to an N-well. For example, when the first power (VDD) is 5 V and the second power (DVDD) is 1.5 V, the first power (VDD) is applied as the N-well bias voltage. Conversely, when the first power (VDD) is 1.5 V and the second power (DVDD) is 5 V, the second power (DVDD) is applied as the N-well bias voltage.

However, in the N-well bias circuit of FIG. 1, when the first power (VDD) and the second power (DVDD) are equal to 1.5 V, or when there is a low voltage state resulting in a voltage difference between the first power (VDD) and the second power (DVDD) of less than a threshold voltage (Vth) (e.g., about 0.7 V or less, which occurs when the first power is 1.5 V and the second power is 1.8 V), the second PMOS transistor (MP2) is turned off. Accordingly, there is a limitation that the N-well bias voltage can be provided only when the first power and the second power (DVDD) have a voltage difference greater than the threshold voltage (e.g., in this example, the first power is less than 1.8 V–the threshold voltage [e.g., 0.7 V]=1.1 V).

The foregoing is intended merely to aid in the understanding of the background of the present disclosure, and is not intended to mean that the present disclosure falls within the purview of the related art that is already known to those skilled in the art.

Document of Related Art

Korean Patent No. 10-1120263 (registered 17 Feb. 2012).

SUMMARY OF THE INVENTION

The present disclosure is directed to providing a low-voltage detection floating N-well bias circuit, wherein when a second power supply (e.g., DVDD) among the power supply voltages provided to the circuit has a low voltage (e.g., the voltage difference between a first power supply such as VDD and the second power supply is less than a threshold voltage of a transistor in the floating N-well bias circuit receiving the second power supply at its gate), the circuit is capable of providing the second power as an N-well bias voltage without dropping the floating N-well bias voltage, and of normally applying the second power as the N-well bias voltage.

It is to be understood that technical problems to be solved by the present disclosure are not limited to the aforementioned technical problems, and other technical problems which are not mentioned may be apparent from the following description to a person skilled in the art to which the present disclosure pertains.

According to one or more embodiments of the present disclosure, there is provided a low-voltage detection floating N-well bias circuit including a power detector configured to detect states of first power (e.g., VDD) and second power (e.g., DVDD) at different power levels; a switch configured to perform a switching operation according to the states of the first power and the second power; and a voltage output circuit configured to output the first power or the second power as an N-well bias voltage according to the states of the first power and the second power and the switching operation of the switch.

The switch may include a first (or fourth) PMOS transistor, a first NMOS transistor, and a second NMOS transistor connected in series between the first power and a ground terminal, wherein the fourth PMOS transistor may include a gate terminal configured to receive an output signal of the power detector, a source terminal configured to receive the first power, and a drain terminal connected to a first node, and the first NMOS transistor may include a drain terminal connected to the first node, a gate terminal configured to receive the second power, and a source terminal connected to a second node, and the second NMOS transistor may include a drain terminal connected to the second node, a grounded source terminal, and a gate terminal configured to receive the first power.

The voltage output circuit may include a second (or third) PMOS transistor, a third (or second) PMOS transistor, and a fourth (or first) PMOS transistor connected between a power terminal and a voltage output terminal, wherein the second (or third) PMOS transistor may include a gate terminal connected to a first node, a source terminal configured to receive the second power, and a drain terminal and a body region connected to each other, the drain terminal being connected to a body region of the first (or fourth) PMOS transistor and connected to the voltage output terminal.

The fourth (or first) PMOS transistor and the third (or second) PMOS transistor may be symmetrical to each other.

The fourth (or first) PMOS transistor may include a source terminal configured to receive the first power, a gate terminal configured to receive the second power, and a body region and a drain terminal connected to the voltage output terminal and to each other, and the third (or second) PMOS transistor may include a source terminal configured to receive the second power, a gate terminal configured to receive the first power, and a drain terminal and a body region connected to the voltage output terminal and to each other.

The fourth (or first) PMOS transistor may be configured to change a voltage at the voltage output terminal to the first power when the first power and the second power are in low level states and the first power then enters a high level state.

The third (or second) PMOS transistor may be configured to change the voltage at the voltage output terminal to the second power when the first power and the second power are in low level states and the second power then enters a high level state, in which case the first PMOS transistor may be turned on.

The first (or fourth) PMOS transistor may be configured to turn off the second (or third) PMOS transistor by applying the first power to the gate terminal of the second (or third) PMOS transistor.

The first NMOS transistor and the second NMOS transistor may be configured to turn on the second (or third) PMOS transistor by applying a ground potential (e.g., 0 V) to the gate terminal of the second (or third) PMOS transistor when the first (or fourth) PMOS transistor is turned off.

The second (or third) PMOS transistor may be configured to apply the second power to the voltage output terminal when the first power and the second power are both in the high level state.

According to one or more other embodiments of the present disclosure, there is provided a low-voltage detection floating N-well bias circuit including a first power terminal configured to supply a first power and a second power terminal configured to supply a second power different from the first power; a voltage output terminal configured to bias an N-well with one of the first and the second powers at the second power terminal as a floating N-well voltage; a first switch between the first power terminal and the voltage output terminal; and a second switch and a third switch between the second power terminal and the voltage output terminal.

The first to the third switches may comprise first, second and third PMOS transistors.

The first PMOS transistor may include a source terminal configured to receive the first power, a gate terminal configured to receive the second power, and a body region and a drain terminal connected to a voltage output terminal and to each other.

The second PMOS transistor may include a source terminal configured to receive the second power, a gate terminal configured to receive the first power, and a drain terminal and a body region connected to a voltage output terminal and to each other.

The third PMOS transistor may include a gate terminal connected to a first node, a source terminal configured to receive the second power, and a drain terminal and a body region connected to each other, the drain terminal being connected to a body region of a fourth PMOS transistor and to the voltage output terminal.

The first PMOS transistor may be configured to provide the first power as the floating N-well voltage when the first power is in a high level state and the second power is in a low level state.

The second PMOS transistor may be configured to provide the second power as the floating N-well voltage when the second power is in the high level state and the first power is in the low level state.

The third PMOS transistor may be configured to provide the second power as the floating N-well voltage when the first power and the second power are both in the high level state and a ground potential (e.g., 0 V) is applied to the gate terminal of the third PMOS transistor.

According to still another embodiment of the present disclosure, there is provided a low-voltage detection floating N-well bias circuit including a first power terminal configured to supply a first power and a second power terminal configured to supply a second power different from the first power; a voltage output terminal configured to bias an N-well with one of the first and second powers at the second power terminal as a floating N-well voltage; a first PMOS transistor between the first power terminal and the voltage output terminal; a second PMOS transistor and a third PMOS transistor between the second power terminal and the voltage output terminal; and a switch configured to turn on and off the third PMOS transistor, wherein the third PMOS transistor is configured to provide the second power as the floating N-well voltage when the first power and the second power are both in a high level state and a ground potential (e.g., 0 V) is applied to a gate terminal of the third PMOS transistor.

The switch may include a fourth PMOS transistor including a gate terminal configured to receive an output signal of a power detector, a source terminal configured to receive the first power, and a drain terminal connected to a first node; a first NMOS transistor including a drain terminal connected to the first node, a gate terminal configured to receive the second power, and a source terminal connected to a second node; and a second NMOS transistor including a drain terminal connected to the second node, a grounded source terminal, and a gate terminal configured to receive the first power.

According to the present disclosure, N-well biasing can be achieved with the first power (e.g., VDD) or the second power without dropping the second power, depending on the voltages or voltage states of the first power and the second power. Accordingly, biasing can be achieved with the floating N-well voltage continuously without dropping the second power when the second power is in a low voltage state and/or is similar to the first power.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Objectives and effects of the present disclosure and technical configurations to achieve them will be apparent with reference to the accompanying drawings and embodiments described below in detail. In describing the present disclosure, if a detailed description of known functions or elements related to the present disclosure may make the gist of the present disclosure unclear, the detailed description will be omitted.

Further, the terms described below are defined considering the functions in the present disclosure, which may vary depending on the intention of the user, the operator, or the custom.

It is noted that the present disclosure is not limited to the following embodiments and may be embodied or implemented in different ways. It should be understood that the embodiments are given to provide complete disclosure of the invention and to provide a thorough understanding of the present disclosure to those skilled in the art. The scope of the present disclosure is defined only by the claims. Therefore, the definition may be based on the contents throughout this specification.

Hereinafter, the present disclosure will be described in more detail with reference to FIG. 2.

Figure 1:
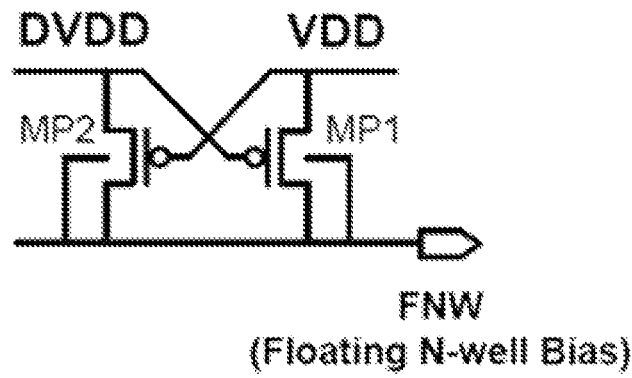
FIG. 1 is a configuration diagram illustrating a general floating N-well bias circuit.
Figure 2:
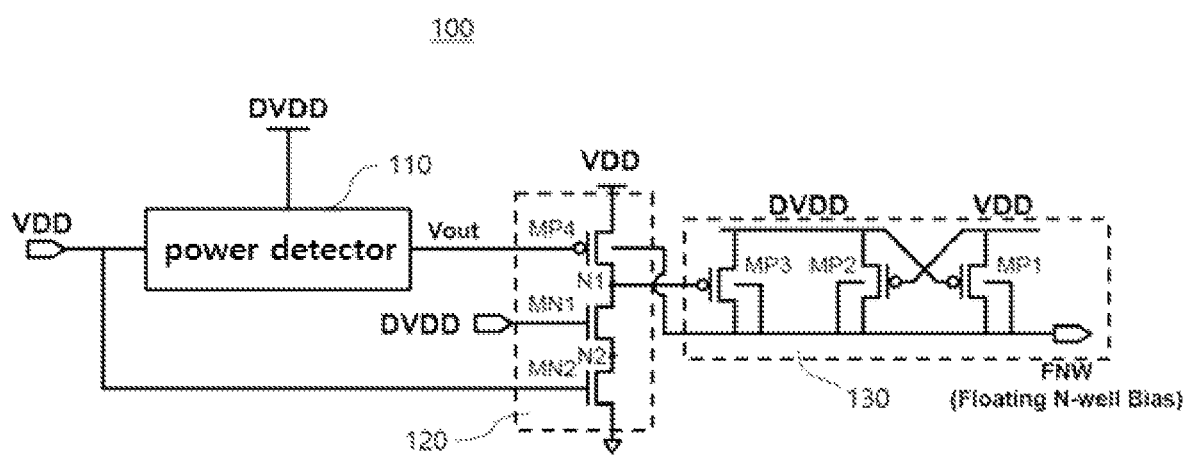
FIG. 2 is a configuration diagram illustrating a low-voltage detection floating N-well bias circuit according to one or more embodiments of the present disclosure.

FIG. 2 is a configuration diagram illustrating a low-voltage detection floating N-well bias circuit according to one or more embodiments of the present disclosure.

As shown in FIG. 2, a low-voltage detection floating N-well bias circuit 100 (hereinafter, referred to as an N-well bias circuit for short) includes a power detector 110, a switch 120 operating according to a detection state of the power detector 110, and a voltage output circuit 130 outputting a floating N-well bias voltage according to a switching operation of the switch 120.

The power detector 110 is a unit that detects on and off states of a first power (VDD) and a second power (DVDD). The on state (and/or the high level state) may refer to a state in which the node or rail carrying the power (i.e., the first power or the second power) is within a predetermined percentage or margin range of the nominal voltage for the power (e.g., VDD±10%, DVDD±0.3 V, etc.). The off state (and/or the low level state) may refer to a state in which the node or rail carrying the power is within a predetermined margin range of a ground potential or 0 V (e.g., −0.5 V to 0.5 V, 0 V±0.3 V, etc.). The power detector 110 is not necessarily limited to a particular circuit configuration, as long as the power detector 110 is capable of detecting on and off states of at least two powers. The power detector 110 may be configured by combining MOS transistors or various logic elements.

The switch 120 includes a first NMOS transistor (MN1), a second NMOS transistor (MN2), and a fourth (or first) PMOS transistor (MP4). A gate terminal of the fourth (or first) PMOS transistor (MP4) receives an output signal (Vout) from the power detector 110, a source terminal of the fourth PMOS transistor (MP4) receives the first power (VDD), and a drain terminal of the fourth PMOS transistor (MP4) is connected to a first node (N1). A drain terminal of the first NMOS transistor (MN1) is connected to the first node (N1), a gate terminal of the first NMOS transistor (MN1) receives the second power (DVDD), and a source terminal of the first NMOS transistor (MN1) is connected to a second node (N2). A drain terminal of the second NMOS transistor (MN2) is connected to the second node (N2), a source terminal of the second NMOS transistor (MN2) is grounded (e.g., connected to a ground potential), and a gate terminal of the second NMOS transistor (MN2) receives the first power (VDD). Between the first power (VDD) and the ground terminal, the fourth PMOS transistor (MP4), the first NMOS transistor (MN1), and the second NMOS transistor (MN2) are connected in series.

The voltage output circuit 130 includes a third (or second) PMOS transistor (MP3) connected to an output of the switch 120 (e.g., the first node N1), and also includes a first (or third) PMOS transistor (MP1) and a second (or fourth) PMOS transistor (MP2) that are symmetrical to each other. A source terminal of the first (or third) PMOS transistor (MP1) receives the first power (VDD), a gate terminal of the first PMOS transistor (MP1) receives the second power (DVDD), and a body region and a drain terminal of the first PMOS transistor (MP1) are connected to the voltage output terminal and to each other. A source terminal of the second (or fourth) PMOS transistor (MP2) receives the second power (DVDD), a gate terminal of the second PMOS transistor (MP2) receives the first power (VDD), and a drain terminal and a body region of the second PMOS transistor (MP2) are connected to the voltage output terminal and to each other. A gate terminal of the third (or second) PMOS transistor (MP3) is connected to the first node (N1), a source terminal of the third PMOS transistor (MP3) receives the second power (DVDD), and a drain terminal and a body region of the third PMOS transistor (MP3) are connected to each other. In addition, the drain terminal of the third PMOS transistor (MP3) is connected to a body region of the fourth (or first) PMOS transistor (MP4) and to the voltage output terminal.

The N-well bias circuit of the present disclosure having such a configuration has a technical feature capable of providing the second power (DVDD) as a floating N-well bias voltage even when the second power (DVDD) is in a low voltage state.

Next, the operation of the N-well bias circuit will be described.

The N-well bias circuit 100 of the present disclosure operates differently, depending on which of the first power (VDD) and the second power (DVDD) (both of which are initially in the low level state, such as a ground potential or 0 V) transitions from the low level state (e.g., 0 V) to a high level state. In other words, when the first power (VDD) transitions from the low level state to the high level state first, the N-well bias circuit 100 operates in a first mode, and when the second power (DVDD) transitions from the low level state to the high level state first, the N-well bias circuit 100 operates in a second mode. The different operations will be described separately.

First Mode

This is a case in which both powers are in low level (e.g., OFF or off) states, and first, the first power (VDD) enters a high level state, and the second power (DVDD) enters a high level state thereafter.

In the first mode, when only the first power (VDD) is in the high level state and the second power (DVDD) is in the low level state (e.g., it has not entered the high level state yet), the second power (DVDD) is in a low level state (e.g., a 0 V state). Therefore, the second PMOS transistor (MP2) and the third PMOS transistor (MP3), the source terminals of which are connected to the second power (DVDD), are turned off, and the first PMOS transistor (MP1), the gate terminal of which is connected to the second power (DVDD), is turned on.

When the first PMOS transistor (MP1) is turned on, the floating N-well voltage at the voltage output terminal is raised to the first power (VDD) and provided to an N-well. That is, the first PMOS transistor (MP1) raises the voltage at the voltage output terminal to the first power (VDD) when the first power (VDD) and the second power (DVDD) are in low level states and the first power (VDD) then enters a high level state.

When the first PMOS transistor (MP1) is turned on, the third PMOS transistor (MP3) should be turned off. This is to ensure that the voltage at the voltage output terminal is the same as the first power (VDD).

Accordingly, the power detector 110 outputs an output signal Vout in a low level state in response to the second power being in a low level state. The output signal Vout turns on the fourth PMOS transistor (MP4), and when the fourth PMOS transistor (MP4) is on, the first power (VDD) is applied to the gate terminal of the third PMOS transistor (MP3). Consequently, the third PMOS transistor (MP3) is turned off. Since the third PMOS transistor (MP3) is off, any leakage current path that might flow to the voltage output terminal while the second power (DVDD) is in the low state (e.g., 0 V) is substantially blocked. That is, the fourth PMOS transistor (MP4) turns off the third PMOS transistor (MP3) by applying the first power (VDD) to the gate terminal of the third PMOS transistor (MP3).

Afterward, when the second power (DVDD) enters the high level state or is turned on, the power detector 110 outputs an output signal Vout in a high level state. Accordingly, the fourth PMOS transistor (MP4) is turned off.

When the fourth PMOS transistor (MP4) is off, the gate terminal of the second NMOS transistor (MN2) receives the first power (VDD), turning on the second NMOS transistor (MN2), and the gate terminal of the first NMOS transistor (MN1) receives the second power (DVDD), turning on the first NMOS transistor (MN1). Thus, a voltage of 0 V is applied to the first node (N1), which is connected to the gate terminal of the third PMOS transistor (MP3), and the third PMOS transistor (MP3) is turned on, thereby supplying the second power to the output terminal of the voltage output circuit 130. The first and second power, both in the high level state, are received at the gates of the PMOS transistors MP1 and MP2, turning off the PMOS transistors MP1 and MP2, and ensuring that the N-well receives the second power as the N-well bias voltage.

In this first mode, even when the second power (DVDD) is a low voltage close to the first power (VDD), the voltage at the voltage output terminal (i.e., of the voltage output circuit 130) is changed (i.e., raised) to the second power (DVDD) to bias the N-well.

Second Mode

This is a case in which both the first and second powers are in the low level (e.g., OFF or off) state, and the second power (DVDD) first enters the high level state, then the first power (VDD) enters the high level state.

In the second mode, when the first power (VDD) is in the low level state (e.g., 0 V), the first PMOS transistor (MP1) is off, while the second PMOS transistor (MP2) is on. Therefore, the floating N-well voltage at the output terminal of the voltage output circuit 130 is the voltage of the second power (DVDD). That is, the second PMOS transistor (MP2) raises the voltage at the output terminal to the second power (DVDD) when the first power (VDD) and the second power (DVDD) are in the low level state, and only the second power (DVDD) enters the high level state and the second PMOS transistor (MP2) is on.

When the output signal Vout of the power detector 110 is in the low level state, the first power (VDD) in the second mode is in the low state (e.g., 0 V), so the fourth PMOS transistor (MP4) and the second NMOS transistor (MN2) are both off. Accordingly, regardless of the condition of the third PMOS transistor (MP3), the floating N-well voltage is the same as the second power (DVDD) as provided by the second PMOS transistor (MP2).

Afterward, when the first power (VDD) enters the high level state, the second PMOS transistor (MP2) turns off, so the second power (DVDD) is no longer the floating N-well bias voltage. That is, considering that the first power (VDD) transitions from a low level state to a high level state, the second PMOS transistor (MP2) is on when the first power (VDD) is in the low level state. However, when the second power (DVDD) in equal to or less than a predetermined voltage (for example, the voltage of the first power [VDD]+ the threshold voltage [Vth] of the second PMOS transistor MP2), the second PMOS transistor (MP2) is off and does not provide the second power (DVDD) to the output terminal of the voltage output circuit 130.

In this case, it is useful to turn on the third PMOS transistor (MP3) to apply the second power (DVDD) to the output terminal of the voltage output circuit 130 as the floating N-well bias voltage. To this end, the output signal Vout of the power detector 110 has the high level state and turns off the fourth PMOS transistor (MP4). The first NMOS transistor (MN1) and the second NMOS transistor (MN2), which are on, turn the third PMOS transistor (MP3) on. When the third PMOS transistor (MP3) is on, the second power (DVDD) is provided to the output terminal of the voltage output circuit 130. That is, the first NMOS transistor (MN1) and the second NMOS transistor (MN2) may turn on the third PMOS transistor (MP3) by applying a ground potential (e.g., 0 V) to the gate terminal of the third PMOS transistor (MP3) when the fourth PMOS transistor (MP4) is off. Herein, of course, the second power (DVDD) and the first power (VDD) respectively applied to the gate terminals of the first NMOS transistor (MN1) and the second NMOS transistor (MN2) are in respective high level states.

In addition, when both the first power (VDD) and the second power (DVDD) are in the high level state, the first PMOS transistor (MP1) and the second PMOS transistor (MP2) are turned off, and the turned-on third PMOS transistor (MP3) applies the second power (DVDD) to the output terminal of the voltage output circuit 130.

As described above, the low-voltage detection floating N-well bias circuit according to the present disclosure is capable of biasing an N-well with the first power (VDD) or with the second power (DVDD), without dropping the second power (DVDD), depending on or regardless of the states of the first power (VDD) and the second power (DVDD).

Various embodiments of the present disclosure have been described for illustrative purposes, and those skilled in the art to which the present disclosure pertains will easily understand that various modifications, changes, and other equivalent embodiments are possible without departing from the gist and scope of the present disclosure. Accordingly, the true range of protection of the present disclosure should be determined by the technical spirit of the following claims.

What is claimed is:

1. A low-voltage detection floating N-well bias circuit, comprising:
a power detector configured to detect states of first power and second power at different power levels;
a switch configured to perform a switching operation according to the states of the first power and the second power; and
a voltage output circuit configured to output the first power or the second power as an N-well bias voltage according to the states of the first power and the second power and the switching operation of the switch, wherein:
the switch comprises a first PMOS transistor, a first NMOS transistor, and a second NMOS transistor connected in series between the first power and a ground terminal,
the first PMOS transistor comprises a gate terminal configured to receive an output signal of the power detector; a source terminal configured to receive the first power; and a drain terminal connected to a first node,
the first NMOS transistor comprises a drain terminal connected to the first node; a gate terminal configured to receive the second power; and a source terminal connected to a second node, and
the second NMOS transistor comprises a drain terminal connected to the second node; a grounded source terminal; and a gate terminal configured to receive the first power.

2. The circuit of claim 1, wherein the voltage output circuit comprises a second PMOS transistor, a third PMOS transistor, and a fourth PMOS transistor connected between a power terminal and a voltage output terminal, and
the second PMOS transistor comprises a gate terminal connected to a first node; a source terminal configured to receive the second power; and a drain terminal and a body region connected to each other, the drain terminal being connected to a body region of the first PMOS transistor and connected to the voltage output terminal.

3. The circuit of claim 2, wherein the fourth PMOS transistor and the third PMOS transistor are symmetrical to each other.

4. The circuit of claim 2, wherein the fourth PMOS transistor comprises a source terminal configured to receive the first power; a gate terminal configured to receive the second power; and a body region and a drain terminal connected to the voltage output terminal and to each other, and
the third PMOS transistor comprises a source terminal configured to receive the second power; a gate terminal configured to receive the first power; and a drain terminal and a body region connected to the voltage output terminal and to each other.

5. The circuit of claim 4, wherein the fourth PMOS transistor is configured to change a voltage at the voltage output terminal to the first power when the first power and the second power are in low level states and the first power then enters a high level state.

6. The circuit of claim 4, wherein the third PMOS transistor is configured to change a voltage at the voltage output terminal to the second power when the first power and the second power are in low level states and the second power then enters a high level state and the second PMOS transistor is thus turned on.

7. The circuit of claim 4, wherein the first PMOS transistor is configured to turn off the second PMOS transistor by applying the first power to the gate terminal of the second PMOS transistor.

8. The circuit of claim 4, wherein the first NMOS transistor and the second NMOS transistor are configured to turn on the second PMOS transistor by applying a ground potential or 0 V to the gate terminal of the second PMOS transistor when the first PMOS transistor is turned off.

9. The circuit of claim 2, wherein the second PMOS transistor is configured to apply the second power to the voltage output terminal when the first power and the second power are in high level states.

10. A low-voltage detection floating N-well bias circuit, comprising:
a first power terminal configured to supply a first power and a second power terminal configured to supply a second power different from the first power;
a voltage output terminal configured to bias an N-well with one of the first power and the second power at the second power terminal as a floating N-well voltage;
a first switch between the first power terminal and the voltage output terminal; and
a second switch and a third switch between the second power terminal and the voltage output terminal.

11. The circuit of claim 10, wherein the first to the third switches comprise first, second and third PMOS transistors.

12. The circuit of claim 11, wherein the first PMOS transistor comprises a source terminal configured to receive the first power; a gate terminal configured to receive the second power; and a body region and a drain terminal connected to the voltage output terminal and to each other.

13. The circuit of claim 12, wherein the first PMOS transistor is configured to provide the first power as the floating N-well voltage when the first power is in a high level state and the second power is in a low level state.

14. The circuit of claim 11, wherein the second PMOS transistor comprises a source terminal configured to receive the second power; a gate terminal configured to receive the first power; and a drain terminal and a body region connected to the voltage output terminal and to each other.

15. The circuit of claim 14, wherein the second PMOS transistor is configured to provide the second power as the floating N-well voltage when the second power is in the high level state and the first power is in the low level state.

16. The circuit of claim 11, wherein the third PMOS transistor comprises a gate terminal connected to a first node; a source terminal configured to receive the second power; and a drain terminal and a body region connected to each other, the drain terminal being connected to a body region of a fourth PMOS transistor and connected to the voltage output terminal.

17. The circuit of claim 16, wherein the third PMOS transistor is configured to provide the second power as the floating N-well voltage when the first power and the second power are both in the high level state and a ground potential or 0 V is applied to the gate terminal of the third PMOS transistor.

18. A low-voltage detection floating N-well bias circuit, comprising:
- a first power terminal configured to supply a first power and a second power terminal configured to supply a second power different from the first power;
- a voltage output terminal configured to bias an N-well with one of the first power and the second power at the second power terminal as a floating N-well voltage;
- a first PMOS transistor between the first power terminal and the voltage output terminal;
- a second PMOS transistor and a third PMOS transistor between the second power terminal and the voltage output terminal; and
- a switch configured to turn on and off the third PMOS transistor, wherein the third PMOS transistor is configured to provide the second power as the floating N-well voltage when the first power and the second power are both in a high level state and a ground potential or 0 V is applied to a gate terminal of the third PMOS transistor.

19. The circuit of claim 18, wherein the switch comprises:
- a fourth PMOS transistor comprising a gate terminal configured to receive an output signal of a power detector; a source terminal configured to receive the first power; and a drain terminal connected to a first node;
- a first NMOS transistor comprising a drain terminal connected to the first node; a gate terminal configured to receive the second power; and a source terminal connected to a second node; and
- a second NMOS transistor comprising a drain terminal connected to the second node; a grounded source terminal; and a gate terminal configured to receive the first power.

* * * * *